United States Patent
Iwai

(10) Patent No.: US 6,838,366 B2
(45) Date of Patent: Jan. 4, 2005

(54) MOS TRANSISTORS AND METHODS FOR MANUFACTURING THE SAME

(75) Inventor: Kazuo Iwai, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/126,593

(22) Filed: Apr. 19, 2002

(65) Prior Publication Data
US 2003/0008487 A1 Jan. 9, 2003

(30) Foreign Application Priority Data
Apr. 19, 2001 (JP) ........................................ 2001-121599

(51) Int. Cl.⁷ .................. H01L 21/3205; H01I 21/4763
(52) U.S. Cl. ...................................... 438/586; 438/682
(58) Field of Search ................................. 438/586, 682, 438/FOR 212, FOR 420

(56) References Cited

U.S. PATENT DOCUMENTS

| | | | | |
|---|---|---|---|---|
| 5,576,244 A | * | 11/1996 | Hayashi et al. | 438/301 |
| 5,731,239 A | * | 3/1998 | Wong et al. | 438/296 |
| 6,200,871 B1 | * | 3/2001 | Moslehi | 438/303 |
| 6,207,543 B1 | * | 3/2001 | Harvey et al. | 438/586 |
| 6,376,320 B1 | * | 4/2002 | Yu | 438/303 |
| 6,387,803 B2 | * | 5/2002 | Talwar et al. | 438/682 |
| 6,524,939 B2 | * | 2/2003 | Tseng | 438/592 |
| 6,610,564 B2 | * | 8/2003 | Fukada et al. | 438/231 |

FOREIGN PATENT DOCUMENTS

| | | |
|---|---|---|
| JP | 11-074219 | 3/1999 |
| JP | 11-121745 | 4/1999 |
| JP | 2000-091560 | 3/2000 |

* cited by examiner

Primary Examiner—George Fourson
Assistant Examiner—Michelle Estrada
(74) Attorney, Agent, or Firm—Konrad Raynes & Victor, LLP; Alan S. Raynes

(57) ABSTRACT

MOS transistors and a methods for manufacturing the same are described. In one such MOS transistor, source and drain regions 12 are formed in an element region on an Si substrate 11, and a gate electrode 14 including silicide is formed through a gate oxide film 13 over a channel region between the source and drain regions 12. The gate electrode 14 is formed such that it includes a polysilicon gate electrode 14 and silicide 142 on an upper portion thereof. At least a thickness of and metal to be contained in the silicide 142 on the gate electrode 14 are selected regardless of silicide 121 provided over the source and drain regions 12. The thickness of the silicide 142 provided over the gate electrode 14 may be greater than the thickness of the silicide 121 provided over the source and drain regions 12.

26 Claims, 6 Drawing Sheets

Fig. 10 (a) (Prior Art)
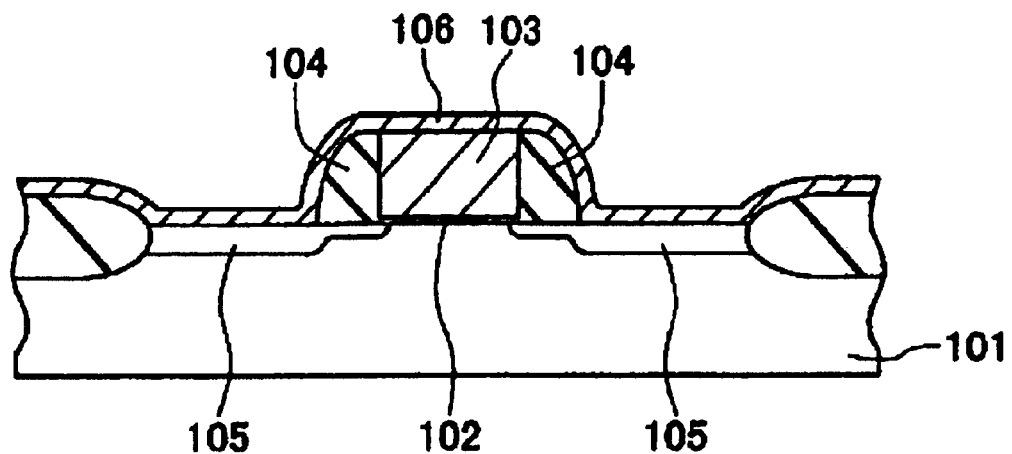
Fig. 10 (b) (Prior Art)
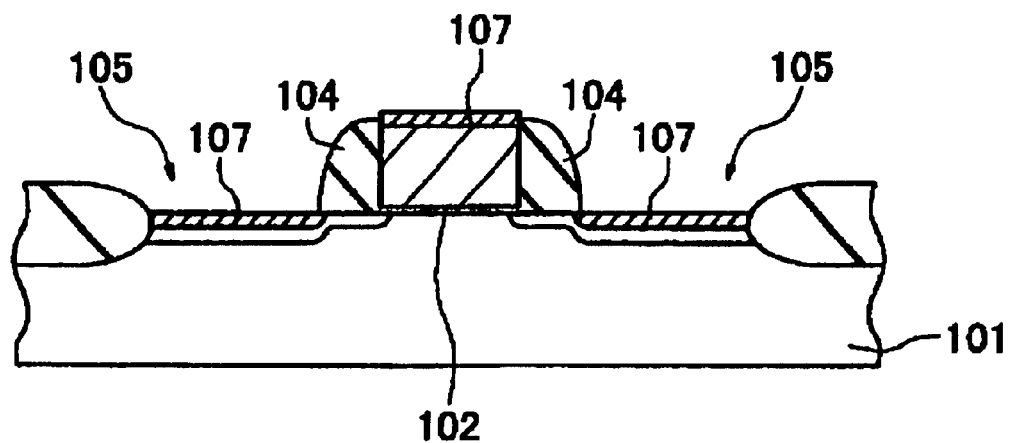

MOS TRANSISTORS AND METHODS FOR MANUFACTURING THE SAME

Applicant hereby incorporates by reference Japanese Application No. 2001-121599(P), filed Apr. 19, 2001, in its entirety.

TECHNICAL FIELD

The present invention relates to miniaturized semiconductor elements, including MOS (Metal Oxide Semiconductor) transistors with a silicide gate and methods for manufacturing the same.

RELATED ART

As progress is made in larger integration and size-reduction of semiconductor integrated circuits, further miniaturization of MOSFETs (MOS field effect transistors) is required. In the miniaturization, the resistance of the polysilicon gate electrode in the MOSFET becomes significantly high. As a result, a high-speed operation cannot be maintained.

It is known that, to lower the resistance of the polysilicon gate electrode, a top portion of the polysilicon gate electrode is silicidized. More specifically, for example, a Ti thin film is formed on the polysilicon gate electrode by a sputtering method, and a heat treatment is conducted on the Ti thin film for silicidizing the same. Then, non-reacted portions of Ti are removed and a heat treatment is conducted again to form a stable silicide layer with low resistance.

FIGS. 10(a) and 10(b) show a process of manufacturing a conventional MOSFET in cross sections in the order of manufacturing steps. The figures show steps of siliciding top portions of the source and drain regions and a top portion of the gate electrode.

As shown in FIG. 10(a), a polysilicon gate electrode 103 is formed over a Si substrate 101 through a gate oxide layer 102. Sidewalls 104 of silicon oxide films, silicon nitride films or the like are formed on side portions of the gate. LDD (Low Doped Drain) structure is provided in the source and drain regions 105. More particularly, an impurity is ion-implanted in the substrate 101 in a low concentration using the polysilicon gate electrode 103 as a mask and in a high concentration using the sidewalls 104 as masks. With the structure described above, for example, a Ti film 106 is formed by a sputtering method over the entire surface of the structure.

Next, as shown in FIG. 10(b), a heat treatment is conducted on the Ti film 106 for silicidizing the same. Then, non-reacted portions of Ti are removed and a heat treatment is conducted again to form silicide layers 107 that are stable and have a low resistance. In other words, the sidewalls 104 suppress silicidation of the side portions of the polysilicon gate electrode 103, and also prevents the polysilicon gate electrode 103 from short-circuiting with the source and drain regions 105.

According to the structure described above, the silicide layers 107 are formed on the polysilicon gate electrode 103 and the source and drain regions 105 by the same process (a self-aligning silicide process or a "salicide process"). Accordingly, there is no substantial difference in the thickness between the silicide layers 107 on the polysilicon gate electrode 103 and on the source and drain regions 105.

SUMMARY

Embodiments relate to a MOS transistor having a gate electrode including a gate electrode silicide, the MOS transistor including an insulation member provided as a sidewall of the gate electrode. The transistor also includes source and drain regions including a source and drain silicide, the source and drain regions positioned adjacent to the insulation member on sides of the gate electrode. The gate electrode silicide and the source and drain silicide include at least one different metal therein.

Embodiments also relate to a method for manufacturing a MOS transistor having a gate electrode including silicide, the method including successively depositing polysilicon and a buffer film on a gate dielectric layer over a silicon semiconductor substrate surrounded by an element isolation region to form a polysilicon gate electrode having the buffer film deposited on a top surface thereof, and patterning the polysilicon gate electrode region. The method also includes introducing an impurity to form source and drain diffusion layers using at least a region of the polysilicon gate electrode and buffer film as a mask. The method also includes depositing an insulation member that covers the polysilicon gate electrode and the buffer film, and forming side walls for the buffer film and the polysilicon gate electrode by anisotropically etching the insulation member. The method also includes forming a first conductive film over the source and drain regions adjacent to the sidewalls on sides of the polysilicon gate electrode, and conducting a first heat treatment to silicidize the first conductive film to selectively form a first silicide on the source and drain regions. The method also includes depositing an insulation layer to cover at least the buffer film on the polysilicon gate electrode, and planarizing the insulation layer to remove the buffer film on the polysilicon gate electrode and expose a top surface of the polysilicon gate electrode. The method also includes forming a second conductive film to cover at least the top surface of the polysilicon gate electrode, and conducting a second heat treatment to silicidize the second conductive film to selectively form a second silicide on the polysilicon gate electrode.

Embodiments also relate to a MOS transistor including a gate electrode including a gate electrode silicide, and source and drain regions including a source and drain silicide. The gate electrode silicide has a thickness that is different than that of the source and drain silicide.

Embodiments also relate to a method for manufacturing a MOS transistor, including forming a gate dielectric region and a polysilicon gate electrode region on the gate dielectric region. The method also includes forming source and drain regions. The method also includes forming a first conductive layer on the source and drain regions and heating the first conductive layer in a first heat treatment to form source and drain silicide regions. In addition, the method includes forming a second conductive layer on the polysilicon gate electrode region and heating the second conductive layer in a second heat treatment to form a gate electrode silicide region.

BRIEF DESCRIPTION OF THE DRAWINGS

Embodiments of the invention are described with reference to the accompanying drawings which, for illustrative purposes, are schematic and not necessarily drawn to scale.

FIGS. 10(a) and 10(b) are cross-sectional views illustrating in the order of manufacturing steps key parts of a conventional method for manufacturing a MOS transistor.

DETAILED DESCRIPTION

Figure 1:
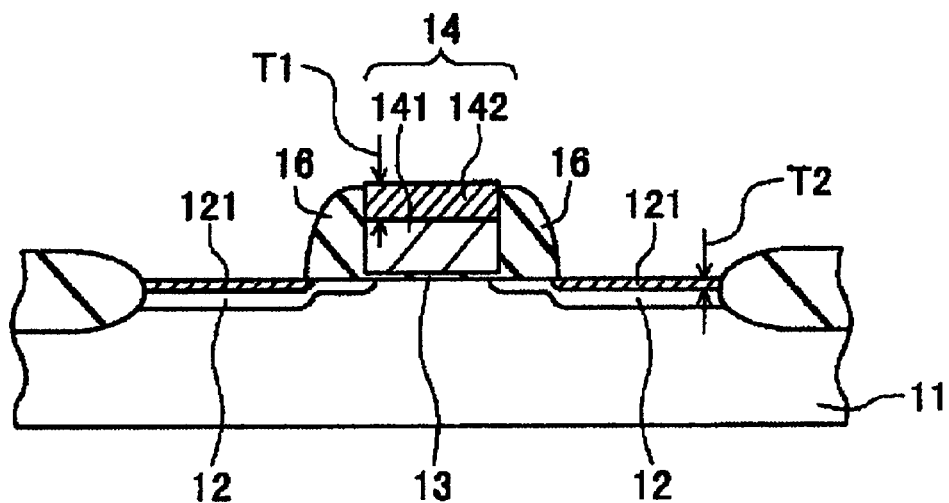
FIG. 1 is a cross-sectional view of a main composition of a MOSFET in accordance with an embodiment of the present invention.

Problems exist with conventional structures such as those shown in FIGS. 10(a) and 10(b) and described earlier. With further miniaturization of MOSFETs, the gate length of polysilicon gate electrodes is shortened, and the line width thereof is further reduced. To lower the resistance of the polysilicon gate electrode, a thicker silicide atop the polysilicon gate electrode 103, is desirable.

In addition, the source and drain regions 105 may be formed shallow to suppress punch-through. As a result, if the silicide layers 107 were formed excessively thick, piecing (spiking) of silicide into the substrate would more likely occur, which would cause junction leaks and therefore is not desirous.

For the reasons described above, in the conventional structure, the silicide layer atop the polysilicon gate electrode cannot be provided with a sufficient thickness, and further reductions in the resistance cannot be achieved. In other words, ordinary salicide processes are becoming impossible to accommodate progresses that are being made in further miniaturization of MOSFET elements.

In view of the circumstances described above, certain embodiments of the present invention provide a MOS transistor that realizes a gate electrode of sufficiently low resistance without a possibility of junction leaks at source and drain regions, and methods for manufacturing the same.

In accordance with certain embodiments of the present invention, in a MOS transistor having a gate electrode including silicide, the MOS transistor is characterized in comprising an insulation member provided as a sidewall of the gate electrode, and silicide on source and drain regions adjacent to the insulation member on both sides of the gate electrode, wherein at least a thickness of and metal contained in the silicide on the gate electrode are selected regardless of the silicide on the source and drain regions.

By the MOS transistor in accordance with certain embodiments of the present invention, the silicide on the gate electrode can be provided, independently of the silicide on the source and drain regions, with a thickness and metal included therein that are advantageous in lowering the resistance.

A preferred embodiment of the present invention is characterized in that the silicide on the gate electrode has a thickness greater than a thickness of the silicide on the source and drain regions. In particular, it is characterized in that the metal that composes the silicide of the gate electrode includes at least one metal selected from Ti, Co, Ni, Zr, Hf, V, Nb, Ta, Pd and Pt. Also, it is characterized in that the metal that composes the silicide on the source and gate regions includes Ti, and the metal that composes the silicide of the gate electrode includes at least one metal selected from Ti, Co, Ni, Zr, Hf, V, Nb, Ta, Pd and Pt.

Furthermore, in the MOS transistor in accordance with certain embodiments of the present invention, in a preferred embodiment with respect to miniaturized gate electrodes, the silicide of the gate electrode is Ti silicide having a thickness greater than at least 70 nm when a gate length is less than 0.22 $\mu$m.

Also, certain embodiments of the present invention pertain to a method for manufacturing a MOS transistor having a gate electrode including silicide, and the method is characterized in comprising the steps of: successively depositing polysilicon and a buffer film through a gate dielectric layer over a silicon semiconductor substrate surrounded by an element isolation region, and patterning the gate electrode having the buffer film deposited on a top surface thereof; introducing impurity to form source and drain diffusion layers using at least a region of the gate electrode as a mask; depositing an insulation member that covers the gate electrode; forming side walls of the buffer film and the gate electrode by anisotropically etching the insulation member; covering a first conductive film over the source and drain regions adjacent to the sidewalls on at least both sides of the gate electrode; conducting a first heat treatment to silicidize the first conductive film to selectively form silicide on the source and drain regions; depositing an insulation layer to cover at least the buffer film on the gate electrode; planarizing the insulation layer to remove the buffer film on the gate electrode and expose a top surface of the gate electrode; covering a second conductive film to cover at least the top surface of the gate electrode; and conducting a second heat treatment to silicidize the second conductive film to selectively form silicide on the gate electrode.

By the method for manufacturing a MOS transistor in accordance with certain embodiments of the present invention, silicidation processes for the top portions of the source and drain regions and the top portion of the gate electrode are conducted independently from one another. When the silicide is formed in the source and drain regions, silicide is not formed on the gate electrode because it is covered by the buffer film and the sidewalls. Thereafter, the insulation layer is planarized and silicide is formed only on the top portion of the gate electrode. As a result, silicide having an appropriate thickness over the source and drain regions, and silicide having an appropriate thickness and appropriate metal to be contained can be selected independently from one another, which contributes toward flexibly accommodating requirements to lower resistances in the miniaturization process.

A method in accordance with a preferred embodiment of the present invention is characterized in further comprising the step of, after the sidewalls are formed, introducing an impurity in the source and drain regions again using a region of the gate electrode and the sidewalls as a mask. Also, in particular, it is characterized in that the second conductive film includes at least one metal selected from Ti, Co, Ni, Zr, Hf, V, Nb, Ta, Pd and Pt. Also, it is characterized in that the first conductive film includes Ti, and the second conductive film includes at least one metal selected from Ti, Co, Ni, Zr, Hf, V, Nb, Ta, Pd and Pt.

FIG. 1 is a cross-sectional view of main compositions of a MOSFET in accordance with an embodiment of the present invention. In an element region on a Si substrate 11, source and drain regions 12 are formed. A gate electrode 14 including silicide is formed through a gate oxide film 13 over a channel region between the source and drain regions 12. The gate electrode 14 is formed such that it includes a polysilicon gate electrode 141 and silicide 142 provided at a top portion thereof.

Also, insulation members 16 are provided as sidewalls of the gate electrode 14. The source and drain regions 12 adjacent to the sidewalls on both side of the gate electrode 14 include silicide 121.

In the present embodiment, at least the thickness of and metal contained in the silicide 142 on the gate electrode 14 are selected regardless of the silicide 121 on the source and drain regions 12. At least in this embodiment, a thickness T1 of the silicide 142 at the gate electrode 14 is greater than a thickness T2 of the silicide 121 in the source and drain regions 12.

The structure described above is characterized by meeting the requirements in lowering the resistance of the gate electrode and suppressing junction leaks in the source and drain regions. In other words, the silicide 141 may be formed as thick as possible in order to lower the resistance of the gate electrode 14 as desired. Also, excessively thick formation of the silicide 121 can be avoided in order to inhibit or prevent junction leaks in the source and drain regions 12.

Also, a structure including Ti silicide may be provided as the silicide 142 at the gate electrode 14 and the silicide 121 at the source and drain regions 12. Ti silicide is considered to have a high capability to suppress the spiking phenomenon at the source and drain regions 12.

Figure 2:
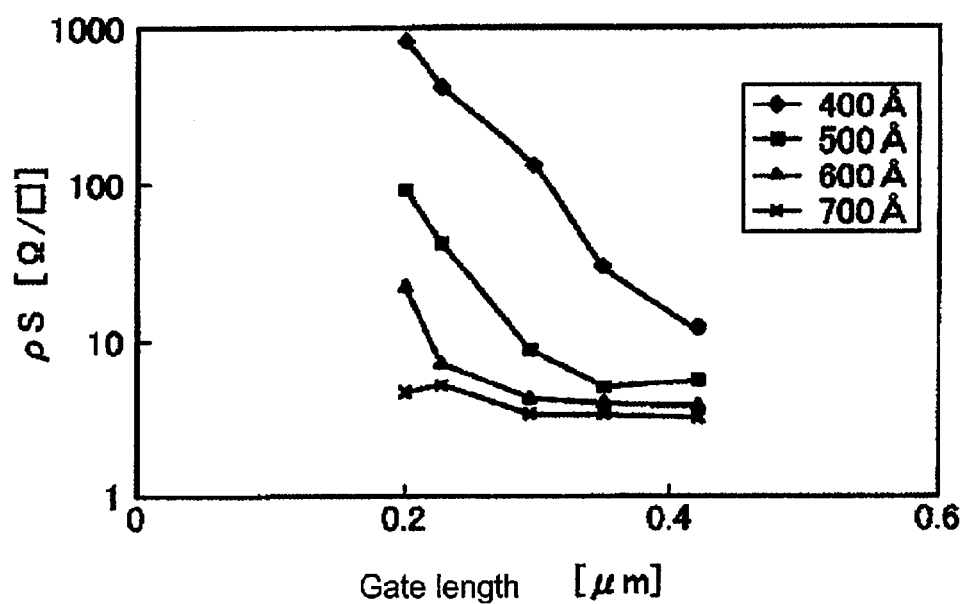
FIG. 2 is a characteristic graph showing relations between gate lengths and sheet resistances under various thickness conditions of Ti silicide when Ti silicide is used as silicide of a gate electrode.

FIG. 2 is a characteristic graph showing relations between gate lengths and sheet resistances under various thickness conditions of Ti silicide when Ti silicide is used as silicide of a gate electrode.

The smaller the thickness of the Ti silicide, the more sharply the gate resistance changes toward higher resistances (due to the thin line effect), as the gate length is shortened to about 0.3 μm to 0.2 μm (0.22 μm). In view of the above, when the gate length is less than 0.22 μm, the silicide at the gate electrode may be formed to a thickness of at least 70 nm (700 Angstroms) or greater. By this, it can be said that the thin line effect is difficult to take place. It is noted that, to form Ti silicide having a thickness of about 70 nm, a Ti film having a thickness of about 40 nm needs to be deposited on the polysilicon gate electrode in the manufacturing process. Also, when the gate length is further reduced and reaches about 0.18 μm, it is desirable for the silicide to have a thickness of about 80 nm or greater in order to alleviate the thin line effect.

Since the silicide 142 is selected regardless of the silicide 121, other combinations such as those described below can also be possible. The silicide 142 at the gate electrode 14 may be formed to include Co silicide, and the silicide 121 at the source and drain regions 12 may be formed to include Ti silicide. Co silicide is observed to have an advantage in that the thin line effect (in which the resistance sharply becomes higher when the gate length is shortened) is reduced compared to Ti silicide, and therefore is suitable as silicide of the gate electrode.

Also, the silicide 142 at the gate electrode 14 may be formed to include Ni silicide, and the silicide 121 at the source and drain regions 12 may be formed to include Ti silicide. Ni silicide can be used as silicide of the gate electrode for the purpose of achieving lower resistances (as it has a lower resistance than Co silicide).

In addition to the above, the silicide 142 at the gate electrode 14 may be formed to include at least one metal selected from W, Zr, Hf, V, Nb, Ta, Pd, and Pt.

FIG. 3–FIG. 9 show cross sections of certain steps of a method for manufacturing a MOS transistor in the order of manufacturing steps in accordance with the present invention. A description is made with the same elements as those shown in FIG. 1 being indicated by the same reference numbers.

Figure 3:
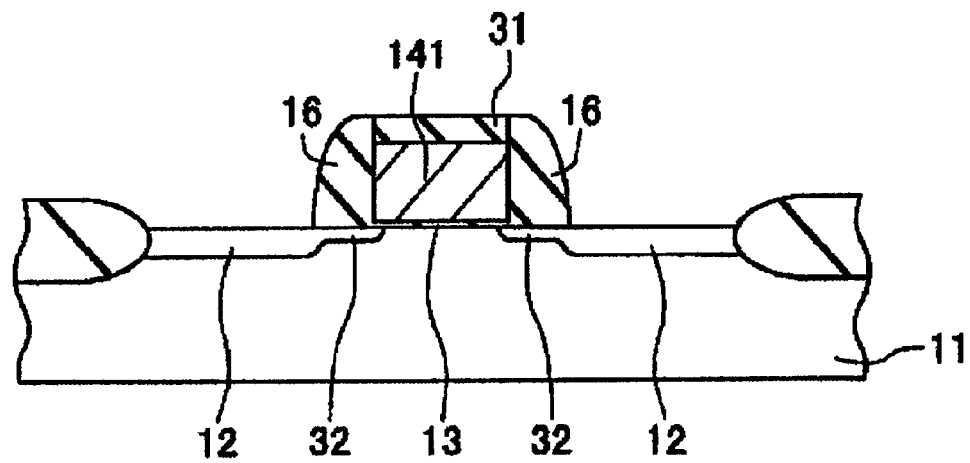
FIG. 3 is a first cross-sectional view illustrating a step of a method for manufacturing a MOS transistor in accordance with an embodiment of the present invention.

First, as shown in FIG. 3, polysilicon and a buffer film 31 composed of, for example, $SiO_2$ are successively deposited through a gate oxide film 13 in an element region on a Si substrate 11, and a patterning is conducted to form a polysilicon gate electrode 141 having the buffer film 31 deposited in layers on a top surface thereof. Then, lower concentration regions 32 in the source and drain for LDD are formed by ion-implanting an impurity, using a region of the gate electrode as a mask. Next, an insulation member 16 composed of, for example, $SiO_2$ is deposited to cover the gate electrode, and an anisotropic etching is conducted to form sidewalls (16). High concentration regions (12) in the source and drain are formed by ion-implanting an impurity, using a region of the polysilicon gate electrode (141) including the buffer film 31 and the sidewalls as a mask.

It is noted that, in the above description, the source and drain regions are formed from the low concentration regions 32 and the high concentration regions (12). However, they may also be formed by only introducing an impurity at an appropriate concentration in a stage in which the low concentration regions 32 are formed.

Figure 4:
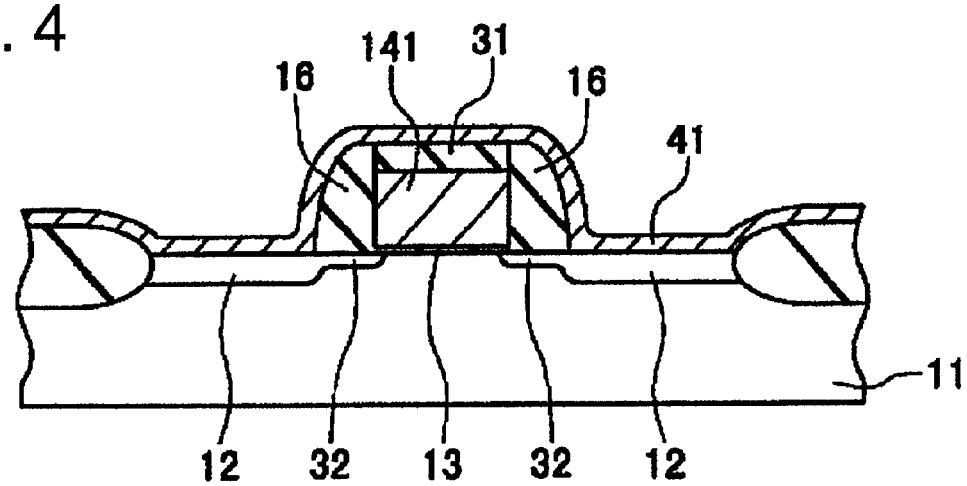
FIG. 4 is a second cross-sectional view illustrating a step of a method for manufacturing a MOS transistor in accordance with an embodiment of the present invention.

Next, as shown in FIG. 4, a conductive film 41 is deposited over the surface to cover the high concentration regions (12) of the source and drain. The conductive film 41 may be composed of, for example, Ti, and may be deposited by a sputtering method. As another example, the conductive film 41 may be composed of W. The thickness of the conductive film 41 influences the thickness of the silicide (121) to be formed later in the high concentration regions (12) of the source and drain. Therefore, the thickness thereof should be controlled so as not to create causes of junction leaks such as spiking.

Figure 5:
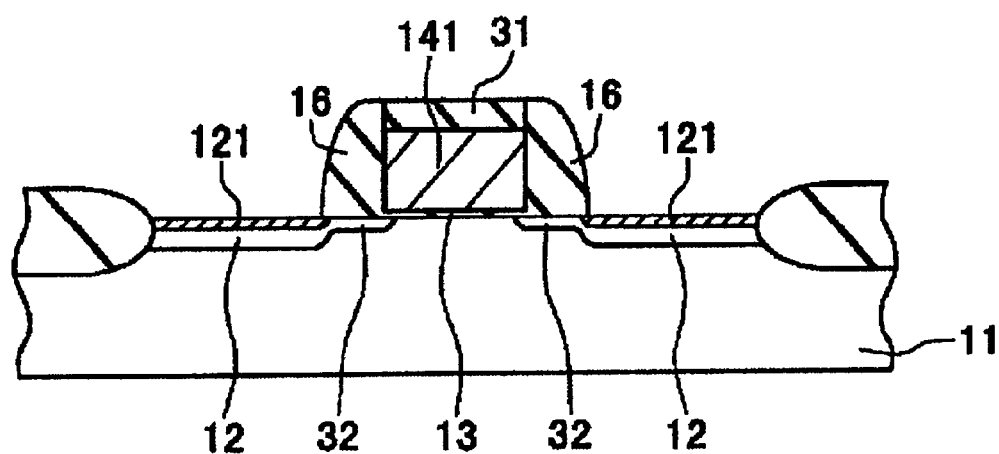
FIG. 5 is a third cross-sectional view illustrating a step of a method for manufacturing a MOS transistor in accordance with an embodiment of the present invention.

Next, as shown in FIG. 5, a heat treatment to promote silicidation of the conductive film 41, in other words, an annealing step is conducted. Then, non-reacted portions of Ti are removed and a heat treatment is conducted again, to form a silicide 121 that is stable and has a low resistance.

Figure 6:
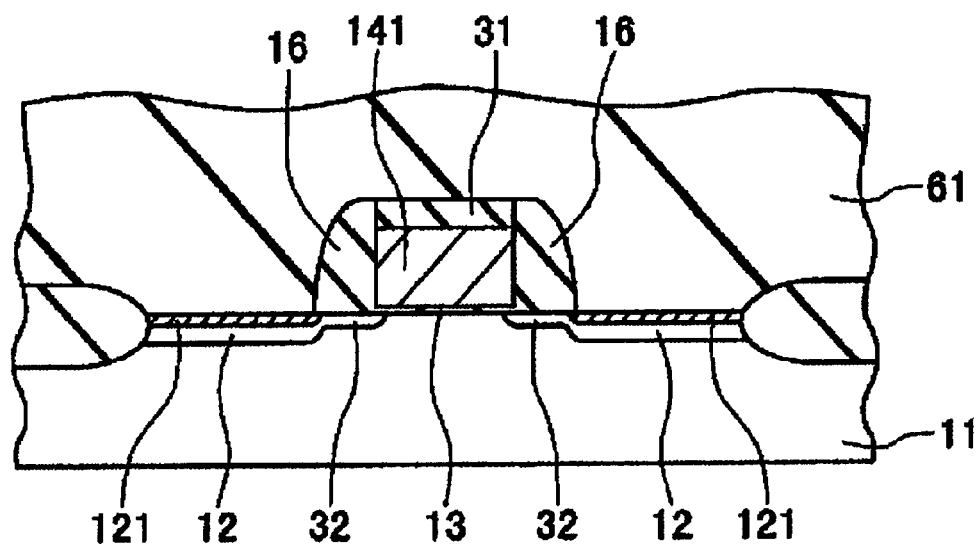
FIG. 6 is a fourth cross-sectional view illustrating a step of a method for manufacturing a MOS transistor in accordance with an embodiment of the present invention.

Next, as shown in FIG. 6, an insulation film 61 composed of, for example, $SiO_2$ is deposited to a thickness that covers at least the buffer film 31 on the polysilicon gate electrode (141). The insulation film 61 and the buffer film 31 may be formed from the same material.

Figure 7:
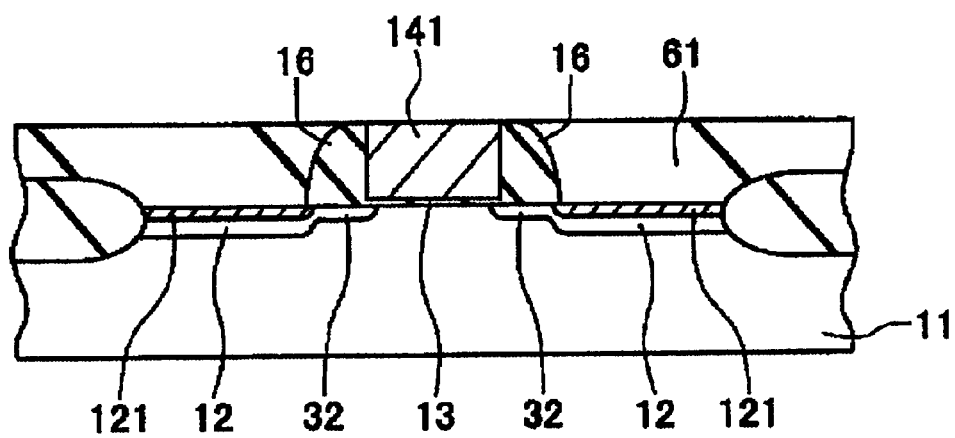
FIG. 7 is a fifth cross-sectional view illustrating a step of a method for manufacturing a MOS transistor in accordance with an embodiment of the present invention.

Next, as shown in FIG. 7, the insulation film 61 is removed by a CMP (Chemical Mechanical Polishing) technique. The insulation film 61 is planarized until the buffer film 31 is removed. This exposes a top surface of the polysilicon gate electrode 141 in the insulation film 61. A polysilicon surface of the polysilicon gate electrode 141 is polished and planarized, whereby formation of more uniform silicide can be expected.

Figure 8:
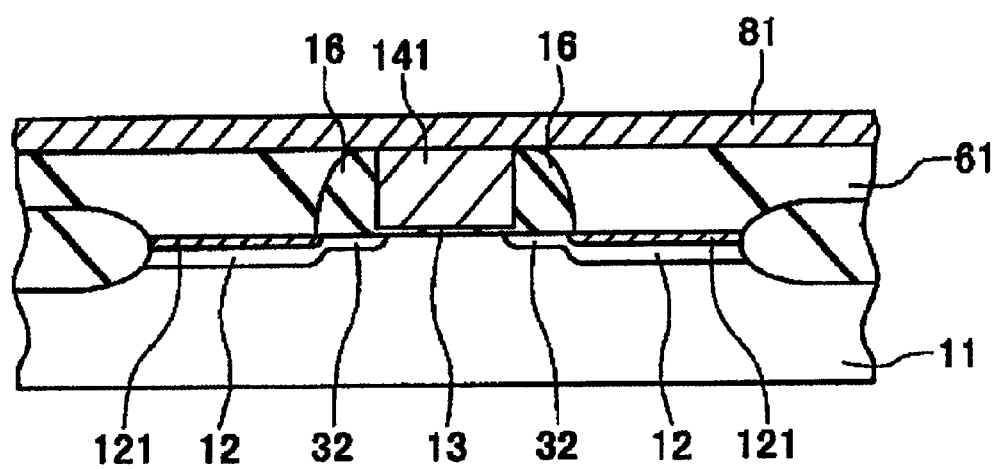
FIG. 8 is a sixth cross-sectional view illustrating a step of a method for manufacturing a MOS transistor in accordance with an embodiment of the present invention.

Next, as shown in FIG. 8, a conductive film 81 is deposited on the surface of the planarized insulation film 61 in which the top surface of the polysilicon gate electrode 141 is exposed at a specified area. The conductive film 81 may be composed of, for example, Ti, Co, Ni or the like, and deposited by a sputtering method. The thickness of the conductive film 81 influences the thickness of the silicide (141) on the polysilicon gate electrode 141, which later becomes a factor to lower the resistance of the gate electrode 14. Therefore, the thickness thereof should be controlled such that it is difficult to generate the influence of the thin line effect of the gate electrode.

Figure 9:
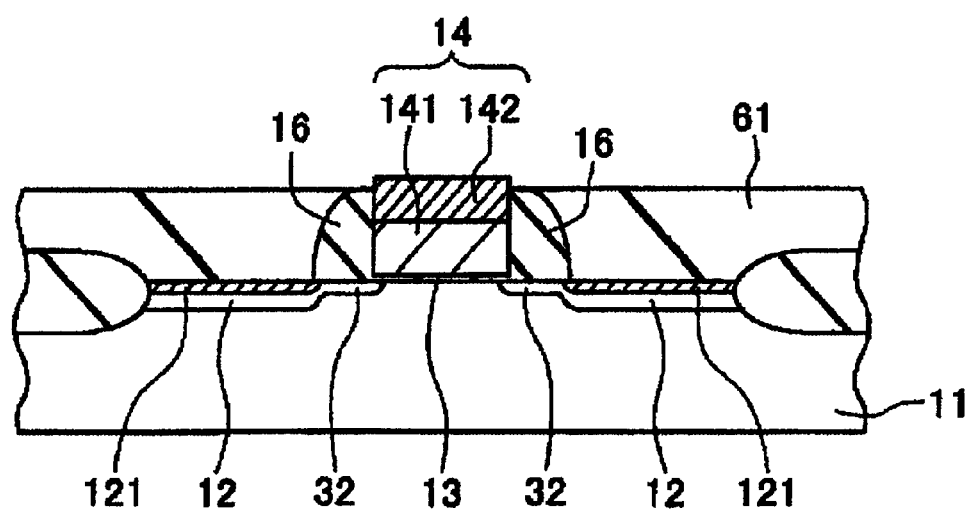
FIG. 9 is a seventh cross-sectional view illustrating a step of a method for manufacturing a MOS transistor in accordance with an embodiment of the present invention.

Next, as shown in FIG. 9, a heat treatment to promote silicidation of the conductive film 81, in other words, an annealing step is conducted. Then, non-reacted portions of the conductive film 81 are removed and a heat treatment is conducted again, to form a silicide 141 that is stable and has a low resistance.

By the method in accordance with the present embodiment, the silicidation processes for the source and drain regions 12 and the gate electrode 14 are achieved independently from one another. When silicide 121 is formed in the source and drain regions 12, silicide is not formed on the polysilicon gate electrode 141 because it is covered by the buffer film 31 and the sidewalls (16). Then, the insulation film 61 is subject to a planarization step, and only the top surface of the polysilicon gate electrode 141 can be silicidized.

As a result, an appropriate thickness of the silicide 121 for the source and drain regions 12, and an appropriate thickness of and appropriate metal to be contained in the silicide 141 for the gate electrode 14 can be selected independently from one another, which permits silicide layers having substantially different thicknesses to be formed if desired, which contributes toward flexibly and reliably accommodating requirements to lower resistances in the miniaturization process.

It is noted that the metal that forms the silicide on the polysilicon gate electrode 141, as another example of the conductive film 81, may be one metal selected from Ti, W, Co, Ni, Zr, HF, V, Nb, Ta, Pd and Pt.

As described above, in accordance with certain embodiments of the present invention, silicide on a gate electrode can be provided with a thickness and metal to be contained therein that are advantageous to lowering the resistance regardless of silicide on source and drain regions. As a result, it is possible to produce MOS transistors that are well adapted for miniaturization and highly reliable and methods for manufacturing the same, which realize a gate electrode with sufficiently low resistance while inhibiting junction leaks at source and drain regions. It should be appreciated by one of ordinary skill that modifications to the embodiments described above are possible within the scope of the present invention.

What is claimed:

1. A method for manufacturing a MOS transistor having a gate electrode including silicide, the method comprising:
   successively depositing polysilicon and a buffer film on a gate dielectric layer over a silicon semiconductor substrate surrounded by an element isolation region to form a polysilicon gate electrode having the buffer film deposited on a top surface thereof, and patterning the polysilicon gate electrode;
   introducing an impurity to form source and drain diffusion layers using at least a region of the polysilicon gate electrode and buffer film as a mask;
   depositing an insulation member that covers the polysilicon gate electrode and the buffer film;
   forming side walls for the buffer film and the polysilicon gate electrode by anisotropically etching the insulation member;
   forming a first conductive film over the source and drain regions adjacent to the sidewalls on sides of the polysilicon gate electrode;
   conducting a first heat treatment to silicidize the first conductive film to selectively form a first silicide on the source and drain regions;
   depositing an insulation layer on the buffer film and on the first silicide, wherein the buffer film and the insulating layer are formed from the same material;
   planarizing the insulation layer to remove the buffer film on the polysilicon gate electrode and expose a top surface of the polysilicon gate electrode;
   forming a second conductive film to cover at least the top surface of the polysilicon gate electrode; and
   conducting a second heat treatment to silicidize the second conductive film to selectively form a second silicide on the polysilicon gate electrode.

2. A method for manufacturing a MOS transistor according to claim 1, further comprising the step of, after the sidewalls are formed, introducing an impurity in the source and drain regions using the polysilicon gate electrode and the sidewalls as a mask.

3. A method for manufacturing a MOS transistor according to claim 1, wherein the second conductive film includes at least one metal selected from Ti, W, Go, Ni, Zr, Hf, V, Nb, Ta, Pd and Pt.

4. A method for manufacturing a MOS transistor according to claim 1, wherein the first conductive film includes Ti, and the second conductive film includes at least one metal selected from Ti, W, Co, Ni, Zr, Hf, V, Nb, Ta, Pd and Pt.

5. A method for manufacturing a MOS transistor according to claim 1, wherein the second conductive layer includes at least one metal that is not in the first conductive layer.

6. A method for manufacturing a MOS transistor according to claim 2, wherein the second conductive film includes at least one metal selected from Ti, W, Go, Ni, Zr, Hf, V, Nb, Ta, Pd and Pt.

7. A method for manufacturing a MOS transistor according to claim 2, wherein the first conductive film includes Ti, and the second conductive film includes at least one metal selected from Ti, W, Go, Ni, Zr, Hf, V, Nb, Ta, Pd and Pt.

8. A method for manufacturing a MOS transistor, comprising:
   forming a gate dielectric region on a substrate;
   forming a gate electrode region on the gate dielectric region;
   forming a buffer film on the polysilicon gate electrode region;
   forming source and drain diffusion layers in the substrate;
   forming an insulation region on the buffer film and on the source and drain diffusion layers, wherein the buffer film and the insulation region are formed from the same material;
   etching the insulation region to form sidewall spacers for the buffer layer and the gate electrode region;
   forming a first conductive layer on the source and drain regions and heating the first conductive layer in a first heat treatment to form source and drain silicide regions;
   forming a second conductive layer on the polysilicon gate electrode region and heating the second conductive layer in a second heat treatment to form a gate electrode silicide region.

9. A method for manufacturing a MOS transistor as in claim 8, further comprising forming the buffer film and the insulation region from $SiO_2$.

10. A method for manufacturing a MOS transistor as in claim 8, further comprising forming the gate electrode silicide region to a thickness that is greater than that of the source and drain silicide regions.

11. A method for manufacturing a MOS transistor as in claim 8, wherein the first conductive layer and the second conductive layer include at least one different metal.

12. A method for manufacturing a MOS transistor according to claim 9, wherein the first conductive layer includes Ti, and the second conductive layer includes at least one metal selected from Ti, W, Co, Ni, Zr, Hf, V, Nb, Ta, Pd and Pt.

13. A method for manufacturing a MOS transistor according to claim 1, further comprising forming the buffer film and the insulation member from the same material.

14. A method for manufacturing a MOS transistor according to claim 1, further comprising forming the buffer film and the insulation member from $SiO_2$.

15. A method for manufacturing a MOS transistor according to claim 1, further comprising forming the buffer film and the insulation layer from $SiO_2$.

16. A method for manufacturing a MOS transistor according to claim 1, further comprising forming the insulation member from $SiO_2$.

17. A method for manufacturing a MOS transistor, comprising:

forming a gate dielectric region on a substrate;

forming a gate electrode layer on the gate dielectric region;

forming a buffer film comprising $SiO_2$ on the gate electrode layer, wherein the gate electrode layer is between the buffer film and the gate dielectric region;

forming source and drain diffusion layers in the substrate using the buffer film and gate electrode layer as a mask;

forming an insulation region on the buffer layer and on the source and drain diffusion layers;

etching the insulation region to form sidewall spacers for the gate electrode layer;

forming a first conductive layer on the source and drain regions and heating the first conductive layer in a first heat treatment to form source and drain silicide regions;

forming a insulating layer on the source and drain silicide regions and on the buffer film;

planarizing the insulating layer to remove the buffer film on the polysilicon gate electrode and expose the polysilicon gate electrode;

forming a second conductive layer on the polysilicon gate electrode region; and heating the second conductive layer in a second heat treatment to form a gate electrode silicide region.

18. A method according to claim 17, further comprising forming the insulating layer from $SiO_2$.

19. A method according to claim 17, further comprising forming the second conductive layer from a material having a different composition than the first conductive layer.

20. A method according to claim 17, further comprising removing an unreacted portion of the second conductive layer after forming the gate electrode silicide region, and then heating the gate electrode silicide region.

21. A method according to claim 17, wherein the first conductive layer includes Ti, and the second conductive layer includes at least one metal selected from Ti, W, Go, Ni, Zr, Hf, V, Nb, Ta, Pd and Pt.

22. A method according to claim 17, further comprising removing an unreacted portion of the second conductive layer after forming the gate electrode silicide region, and then heating the gate electrode silicide region.

23. A method for manufacturing a MOS transistor, comprising:

forming a gate oxide region on a silicon substrate;

forming a gate electrode region on the gate oxide region;

forming a buffer film on the polysilicon gate electrode region;

forming source and drain diffusion layers in the silicon substrate;

forming an insulation region on the buffer layer and on the source and drain diffusion layers;

etching the insulation region to form sidewall spacers for the gate electrode region;

forming a first conductive layer on the source and drain regions and heating the first conductive layer in a first heat treatment to form source and drain silicide regions;

forming an insulating layer on the source and drain silicide regions and on the buffer film, wherein the insulating layer and the buffer film are formed from the same material;

exposing the gate electrode region by removing a portion of the insulating layer and removing the buffer film; and forming a second conductive layer on the polysilicon gate electrode region and heating the second conductive layer in a second heat treatment to form a gate electrode silicide region.

24. A method according to claim 23, further comprising forming the buffer film and the insulating layer from a material comprising $SiO_2$.

25. A method according to claim 23, further comprising removing an unreacted portion of the second conductive layer after forming the gate electrode silicide region, and then heating the gate electrode silicide region.

26. A method according to claim 23, further comprising forming the first conductive layer to have a different composition than the second conductive layer, wherein the first conductive film includes Ti, and the second conductive film includes at least one metal selected from Ti, W, Go, Ni, Hf, V, Nb, Ta, Pd and Pt.

* * * * *